United States Patent [19]

Okazaki et al.

[11] Patent Number: 5,316,639
[45] Date of Patent: May 31, 1994

[54] DIELECTRIC MATERIAL USED FOR AN OZONE GENERATOR AND A METHOD OF FORMING A FILM TO THE DIELECTRIC MATERIAL

[75] Inventors: Sachiko Okazaki, 20-11, Takaidohigashi 2-Chome, Suginami-ku, Tokyo 168; Masuhiro Kogoma, 15, Shimoniikura, Wakou-shi, Saitama 351-1; Masahiro Hirakawa, Ibaraki, all of Japan

[73] Assignees: Sachiko Okazaki, Tokyo; Masuhiro Kogoma, Saitama; Sumitomo Precision Products Co., Ltd., Hyogo, all of Japan

[21] Appl. No.: 989,480

[22] Filed: Dec. 7, 1992

Related U.S. Application Data

[63] Continuation-in-part of Ser. No. 754,159, Sep. 3, 1991, abandoned, which is a continuation-in-part of Ser. No. 533,394, Jun. 5, 1990, abandoned.

[30] Foreign Application Priority Data

Jun. 5, 1989 [JP] Japan .................. 1-143610

[51] Int. Cl.$^5$ .............................. C23C 14/00
[52] U.S. Cl. .................. 204/192.12; 204/167; 422/186.07
[58] Field of Search ............ 204/192.12, 164, 167; 427/39, 38; 422/186.18, 186.07

[56] References Cited

U.S. PATENT DOCUMENTS

| | | | |
|---|---|---|---|
| 4,138,306 | 2/1979 | Niwa | 204/164 |
| 4,178,877 | 12/1979 | Kudo | 204/164 |
| 4,289,797 | 9/1981 | Akselrad | 427/39 |
| 4,690,803 | 9/1987 | Hirth | 422/186.18 |
| 4,845,054 | 7/1989 | Mitchener | 427/255.3 |
| 4,849,259 | 7/1989 | Bird et al. | 427/255.3 |
| 4,869,976 | 9/1989 | Tawada et al. | 427/39 |
| 4,877,641 | 10/1989 | Dory | 427/255.3 |
| 4,877,651 | 10/1989 | Dory | 427/255.3 |
| 4,956,204 | 9/1990 | Amazawa et al. | 427/248.1 |
| 4,970,056 | 11/1990 | Wooten et al. | 422/186.07 |

FOREIGN PATENT DOCUMENTS 0150429 2/1989 Japan .

OTHER PUBLICATIONS

Vossen and Kern, "Thin Film Processes", Academic Press, New York, 1978.

Primary Examiner—John Niebling
Assistant Examiner—Kishor Mayekar
Attorney, Agent, or Firm—Watson, Cole, Grindle & Watson

[57] ABSTRACT

This invention concerns a $SiO_2$, $SiN_x$ protection film formed by a CVD or PVD gas phase glowing method capable of preventing melting of the matrix ingredients at the surface of a dielectric material in electric discharge of an ozone generator and it relates to a dielectric material used for an ozone generator capable of overcoming the problems for the abrasion of electrode and dielectric material or melting of ions or molecules of during electric discharge, as well as a method of forming a protection film therefor based on the finding that an $SiO_2$ film or $SiN_x$ film can be formed easily on a surface of a predetermined electric material or, further, on a surface of electrode by processing a specific reaction gas, for example, comprising a crude gas such as $SiH_4$, $SiCl_4$, $N_2$, $NH_3$ or TEOS or further incorporated with an inert gas or like by means of an atmospheric CVD process such as CVD or heat CVD and, in particular, on the finding that the protection film can be disposed directly to the surface of the dielectric material and the electrode in an ozone generator after the completion of assembling.

4 Claims, 3 Drawing Sheets

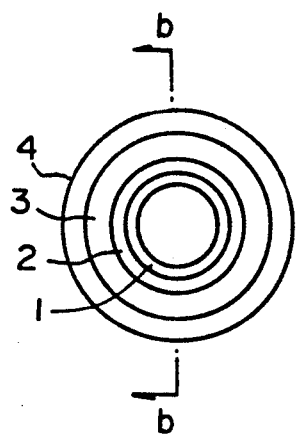
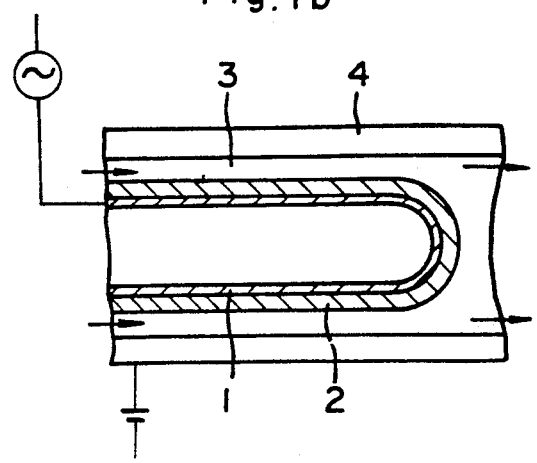
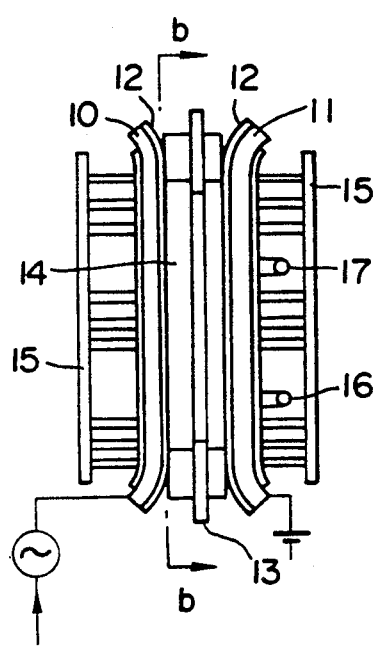
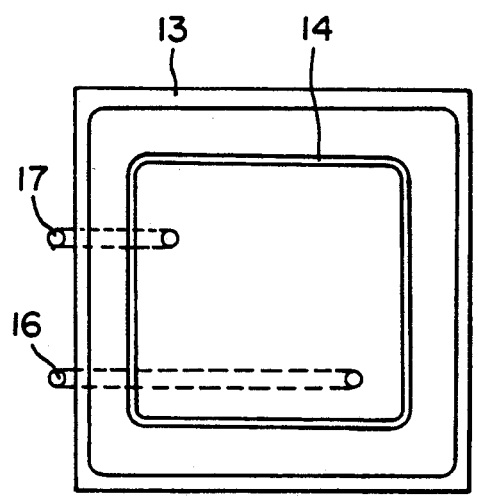
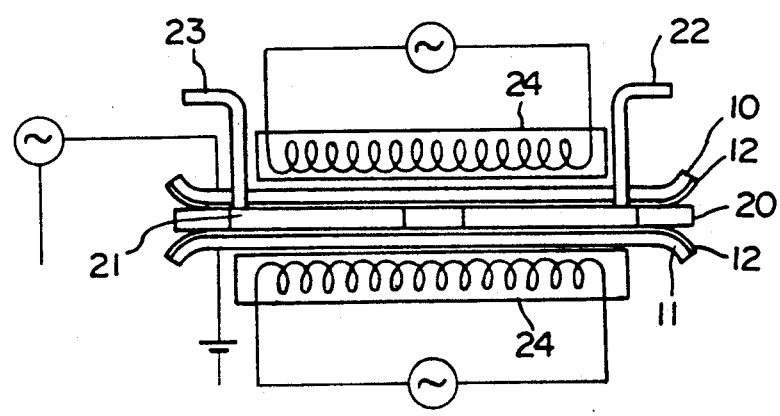

DIELECTRIC MATERIAL USED FOR AN OZONE GENERATOR AND A METHOD OF FORMING A FILM TO THE DIELECTRIC MATERIAL

CROSS-REFERENCE TO RELATED APPLICATIONS

This application is a continuation-in-part of U.S. patent application Ser. No. 754,159, filed Sep. 3, 1991, now abandoned, which was a continuation-in-part of U.S. patent application Ser. No. 533,394, filed Jun. 5, 1990, now abandoned.

TECHNICAL FIELD

The present invention concerns an ozone generator which is capable of supplying a high concentration of pure gaseous ozone at high concentration for manufacturing semiconductors, and, more particularly to a method of forming a protective film of $SiO_2$ and/or $SiN_x$ onto a dielectric material used in an ozone generator.

BACKGROUND ART

Ozone generators are used for sterilization and odor killing in refrigerators and rooms, and ozone is used as an oxidant and a sterilizer in plants where chemical and medicinal plants as well as in semiconductor devices are manufactured. This is in addition to conventional use in excrement processing facilities or sewage facilities.

Furthermore, in the production of semiconductor devices, $SiO_2$ film is used as an interlayer insulation film for Al wirings, and a CVD (chemical vapor deposition) using TEOS (organic silane) and gaseous ozone of excellent step coverage has been examined for embedding to flatten the grove shape between the wirings.

For general ozone generators, a method of generating a great amount of ozone by silent electric discharge process using air or oxygen as a starting material has been used.

In the silent discharge type ozone generator, a dielectric material is inserted and disposed between electrodes opposed to each other, a high voltage is applied between the electrodes and an oxygen-containing gas is passed through a discharge gap to obtain ozone.

A tubular ozone generator as shown in FIG. 1 has a construction in which a glass tube dielectric material (2) is disposed so as to surround a cylindrical tubular high voltage electrode (1) and a tubular water cooling grounding electrode (4) made of stainless steel is disposed by way of a required discharge gap (3), in which air or oxygen is passed through the discharge gap (3) to obtain ozone, the grounding electrode being a double tube through which a coolant such as water is passed.

In addition, Japanese Patent Publication Sho 51-6110, Japanese Patent Publication Sho 46-42748, etc., propose, cylindrical ozone generators of the similar construction.

Further, a plane type ozone generator as shown in FIG. 2 has a structure in which a pair of high voltage electrodes (10) and a grounding electrode (11), each laminated with a dielectric material (12) on a flat electrode surface, are opposed to each other by way of an insulating separator (13) and air or oxygen is introduced from one of holes in the direction of an orthogonal line in the thus formed electric discharge gap (14) and ozone is obtained from the other of the holes.

In addition, Japanese Patent Publication Sho 45-22930, Japanese Patent Publication Sho 51-6111, Japanese Patent Laid Open Sho. 51-148290, Japanese Utility Model Laid Open Sho 61-125485, etc., propose plate-type ozone generators.

The ozone generators having the respective constructions as described above involve a problem that since dielectric material is impinged by electrons at high voltage upon discharge in a cell in the device, ingredients of the dielectric material such as enamel or glass may intrude into gaseous ozone, or melting of ions or molecules of the electrode may occur to contaminate the generated gaseous ozone.

In view of the above, ceramics with less abrasion, free from leaching of ions or molecules and having high specific dielectric constant have been used for the dielectric material (Japanese Patent Laid Open Sho 55-37483).

Such ceramics are shaped and sintered into various shapes depending on the constructions of the ozone generators, but it can not be said that the moldability is satisfactory and there is a requirement of securing close bondability with the electrode to prevent oxidative corrosion with respect to the electrode (Japanese Patent Publication Sho. 62-7121).

In particular, such an extremely high cleanness as not containing particles, metal ions, etc., is required for gaseous ozone at high concentration used for the semiconductor steps. However, since the ingredients of the matrix of the dielectric material may possibly be incorporated, even though in small amounts, into the gaseous ozone, there is a problem that the utilization in a semiconductor production device is hindered. In view of the foregoing present situation for the ozone generator, it is an object of the present invention to provide an ozone generator capable of disposing a protection film of excellent abrasion resistance extremely easily to the surface of the dielectric material and preventing abrasion of the dielectric material and melting of ions and molecules due to dielectric discharge as an industrially preferable productivity and it is an object thereof to provide a dielectric material having a protection film used for an ozone generator and a method of forming such a protection film.

SUMMARY OF THE INVENTION

The present inventors have considered it desirable to use enamel, glass, etc., capable of securing close bondability with electrodes of various shapes as the dielectric material in an ozone generator in view of the productivity and moldability thereof and, at first, have noted on disposing a ceramic protection film on the surface of the dielectric material for overcoming the foregoing problem of abrasion and melting of ions or molecules.

For instance, it has been found extremely effective to provide a ceramic protection film on the surface of the dielectric material by means of a sputtering device for preventing melting of matrix ingredients.

However, for disposing a ceramic protection film by using a required ceramic target in a low pressure sputtering device, for example, it is necessary to expose only the surface of the dielectric material by disposing a mask to an electrode and then applying necessary sputtering, after the sputtering the mask is removed and then the ozone generator is assembled. In the case of using enamel, the electrode is contaminated with scales due to sintering so that it gives rise to the problems such as bring about undesired effect to a sputtering device, requiring many steps for disposing the ceramic protection film by using the low pressure sputtering device and so forth.

Then, the present inventors have made various studies with an aim of obtaining a protection film capable of preventing melting of matrix ingredients on the surface of the dielectric material upon electric discharge, as well as a easy method of forming the film and, as a result, we have noted that $SiO_2$, $SiN_x$ films formed by normal pressure CVD (chemical vapor deposition) to the protection film are most suitable and, further, have made various studies on the film forming method capable of disposing the protection film extremely easily. As a result, it has been found that $SiO_2$ film, $SiN_x$ film can easily be formed on the required surface of the dielectric material or, further, the electrode surface by processing a starting gas such as, for example, mono silane: $SiH_4$, silicon tetrachloride: $SiCl_4$, nitrogen: $N_2$, ammonia: $NH_3$, or tetraethyl orthosilicate (TEOS) or a specific reactive gases further incorporated with an inert gas or like under plasma CVD process such as normal pressure CVD or hot CVD. In particular, it has been found that the normal pressure CVD process has a feature capable of disposing a protection film directly to the surface of a dielectric material or electrode in an ozone generator after complete assembling and have accomplished the present invention.

That is, the present invention concerns a dielectric material used for an ozone generator having a protection film comprising $SiO_2$ and $SiN_x$ formed by a vapor phase epitaxy to the surface of the dielectric material in an ozone generator.

In the present invention, the protection film comprising $SiO_2$ and $SiN_x$ formed by the vapor phase epitaxy may be prepared by a CVD process as described above and, further, also by a PVD process such as vacuum vapor deposition, sputtering, ion plating, etc.

Further, in a case of the plasma CVD process, the present invention concerns a method of forming a film to a dielectric material used for an ozone generator, which comprises:

opposing a pair of cells of an ozone generator constructed by depositing or opposing a dielectric material to the surface of electrode by way of an appropriate spacer, thereby forming a discharge space with a required opposing distance, introducing a reaction gas comprising a starting gas and an inert gas or like depending on the species of a film to be formed into a discharge space while heating the pair of cells as required, applying a high voltage between the electrodes of the cells, thereby causing glow discharge at an atmospheric pressure and forming a protection film to the surface of the dielectric material, In a case of the plasma CVD process, the present invention further concerns a method of forming a film to a dielectric material used for an ozone generator which comprises, in an ozone generator assembled by constituting cells by depositing or opposing dielectric material on the surface of the electrode, introducing a reaction gas comprising a starting gas and an inert gas or like depending on the species of a film to be formed into the discharge space while heating the pair of cells as required.

Further, the present invention concerns a method of forming a film to a dielectric material used for an ozone generator which comprises, in a case of plasma CVD, using a device having a discharging section in which one or a plurality of discharging spaces formed between a high voltage electrode and a grounding electrode formed by depositing or opposing dielectric material to the surface of the electrodes and having a blowing port disposed to the downstream of the discharging section, disposing a blowing port at a required opposing distance to the surface of the dielectric material of the cell, causing a reactive gas comprising a starting gas and an insert gas or like depending on the species of a film to be formed to pass through a discharge space at an atmospheric pressure of from $10^{-2}$ Torr to 0.5 kg/cm² by applying a high voltage between said electrodes thereby forming a protection film to the surface of the dielectric material.

Furthermore, the present invention concerns a method of forming a film to a dielectric material used for an ozone generator in a case of a hot CVD, which comprises opposing a gas blowing port of a mixer with a required opposing distance to the surface of the dielectric material of the heated cell, mixing and jetting a reaction gas comprising a starting gas and an inert gas or like and an gaseous ozone by the mixer and jetting out them, and forming a protection film on the surface of the dielectric material.

BRIEF DESCRIPTION OF THE DRAWINGS

FIGS. 1a and 1b are a front elevational view and a vertical cross sectional view of a tubular ozone generator;

FIG. 2a and FIG. 2b are a front elevational view and a vertical cross sectional view of a plate-type ozone generator;

FIG. 3 is a schematic explanatory view of a plasma CVD device showing a film-forming method in accordance with the present invention;

DETAILED DESCRIPTION OF THE PREFERRED EMBODIMENTS

Figure 4:
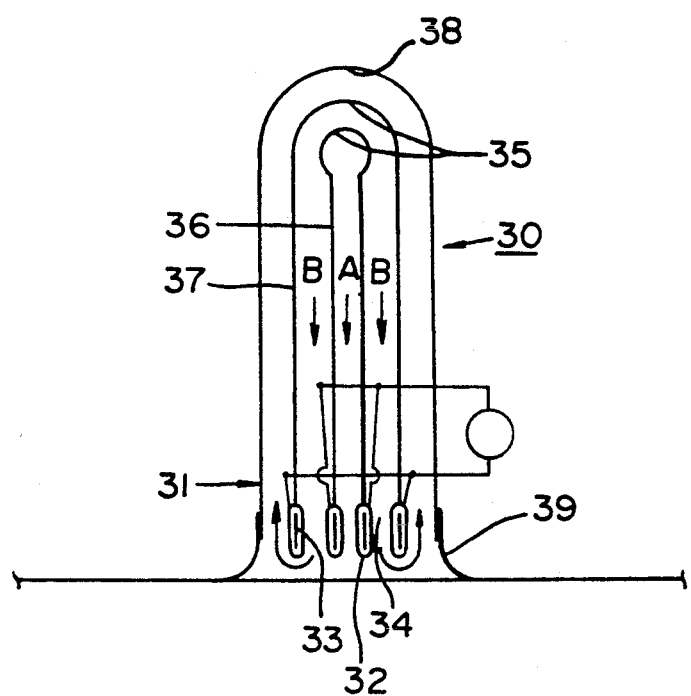
FIG. 4 is a schematic explanatory view for another plasma CVD device.

The present invention will be explained in more detail referring to the appended drawings.

EXAMPLE 1

A film forming method for a protection film in accordance with the present invention will be explained in a case applied to a typical tubular ozone generator shown in FIG. 1.

The tubular ozone generator has a construction in which a glass tube dielectric member (2) is deposited so as to surround a tubular high voltage electrode (1) closed at the top and a cylindrical grounding electrode (4) made of stainless steel is disposed by way of a required discharge gap (3), in which air or oxygen is passed through the cylindrical discharge space (3) and a high voltage is applied between the high voltage electrode (1) and the grounding electrode (4) to obtain ozone. Further, the grounding electrode (4) is formed as a double tube in which the coolant such as water is inserted and cooled.

Although not illustrated, the tubular grounding electrode (4) made of stainless steel is closed at both ends thereof forming an introduction port for air or oxygen at one end and a discharge port for generated ozone at other end, and the discharge space (3) as an ozone generating space has a tightly closed structure.

It is so constructed that a reaction gas comprising an insert gas or like and a starting as in admixture is introduced into the discharge gap (3) kept at an atmospheric pressure of 0.6 kg/cm² and, usually, the gases uniformly passed upon introduction of air or the oxygen at the inside of the discharge gap (3), and the reaction gas is uniformly diffused relative to the dielectric material (2).

After introducing the reactive gas, a predetermined voltage is applied between the high voltage electrode (1) and the grounding electrode (4), by which glow discharge is caused to excite plasmas in the reaction gas and a predetermined protection can be disposed to the surface of the glass tube dielectric material (2) and the surface of the tubular grounding electrode (4) made of stainless steel.

For preventing the melting of ions and molecules of the glass tube dielectric material (2), a tubular ozone generator using quartz glass for the dielectric material has been used often but, by the use of usual glass instead of quartz glass and forming a protection film of $SiO_2$, $Si_3N_4$, etc., by the method according to the present invention, an inexpensive ozone generator can be provided.

EXAMPLE 2

A method of forming a protection film in accordance with the present invention will be explained in a case applied to a typical plate-like ozone generator shown in FIG. 2.

The plate-type ozone generator shown in FIG. 2 has such a construction that a pair of a high voltage electrode (10) and a grounding electrode (11), each laminated with a dielectric material (12) on the electrode plane, are opposed by way of an insulative separator (13), and an introduction tube (16) for introducing air or oxygen and an ozone discharge tube (17) are disposed passing through the electrodes (10), (11) along the direction of a diagonal line as shown in the drawing in the thus formed discharge gap (14).

When a reaction gas comprising an inert gas or like and a starting gas in admixture is introduced into the discharge gap (14) kept at an atmospheric pressure of 0.5 kg/cm², the reaction gas is uniformly diffused to the dielectric material (12) due to the effect of disposing the introduction tube (16) and the discharge tube (17) described above.

After introducing the reaction gas, when a predetermined voltage is applied between the high voltage electrode (10) and the grounding electrode (11), glow discharge occurs to excite plasma in the reaction gas and a predetermined protection film can be formed to the surface of the dielectric material (12).

For instance, in the ozone generator shown in FIG. 2 in which the enamel dielectric material is deposited on the high voltage electrode, $SiN_x$ film was formed under the following conditions.

(1) Reactive gas
Ingredients $He-SiCl_4-N_2-H_2$

| | | | |
|---|---|---|---|
| Flow rate | He | 5000 | cm³/min |
| | $SiCl_4$ | 0.48 | cm³/min |
| | $N_2$ | 20 | cm³/min |
| | $H_2$ | 20 | cm³/min |
| (2) | Discharge | | |
| | Atmospheric pressure of 0.5 kg/cm², normal temperature RF 13.56 MHz, 200 W | | |
| (3) | Enamel dielectric material | | |
| | Thickness 0.3 mm | | |
| (4) | Substrate temperature | 400° C. | |
| | Ingredient | | |
| | Silica | 35% | |
| | Boron oxide | 18% | |
| | Alkali metal (Na, K) | 17% | |
| | Titanium dioxide | 22% | |
| | Alumina | 1% | |
| | Fluorine | 5% | |
| | Phosphorous pentoxide | 2% | |

By the film-forming method in accordance with the present invention, an $SiN_x$ film is obtained at a film-forming rate of 5 um/hr to the enamel dielectric material. The deposition strength is satisfactory and the film thickness is homogenous.

The ozone generator in accordance with the present invention in which the protection film is disposed to the dielectric material can prevent abrasion of the dielectric material and melting of ions and molecules due to electric discharge during use.

EXAMPLE 3

Explanations have been made in Example 2 for the case of directly disposing the protection film to the dielectric material of the plate-type ozone generator completed with assembling. In this case, explanation will be made to an example of disposing a protection film to the high voltage electrode (10) and the grounding electrode (11) before assembling referring to FIG. 3.

A pair of a high voltage electrode (10) and a grounding electrode (11), each laminated with a dielectric material (12) on the electrode plane, are opposed by way of an appropriate insulative separator (20), and an introduction tube (22) for introducing a reaction gas and an exhaust tube (23) are disposed passing through the electrode (10) as shown in the drawing and, further, a heater (24) is disposed for heating the high voltage electrode (10) and the grounding electrode (11) in the thus formed electric discharge gap (21).

After introducing the reaction gas comprising an inert gas or like and a starting gas in admixture into the discharge gap (21) kept at an atmospheric pressure of 0.5 kg/cm², when a predetermined voltage is applied between the high voltage electrode (10) and the grounding electrode (11), glow discharge is generated to excite plasma in the reactive gas and a predetermined protection film can be disposed on the surface of the dielectric material (12).

For instance, in a case of depositing the enamel dielectric material to the electrode, an $SiO_2$ film is formed under the following conditions.

The high voltage electrode (10) and the grounding electrode (11) cell is heated to 200°-300° C. by means of the heater (24).

TEOS+He are introduced into the discharge gap (21) applied with the predetermined voltage and stable glow discharge with He at an atmospheric pressure of 0.5 kg/cm² is caused and TEOS is decomposed with the active species generated by the glow discharge, $O_2$ contained in He, or $O_2$ additionally supplied to the introduction gas, to form an $SiO_2$ film. on the surface of the dielectric material (12).

| TEOS (Tetraethyl orthosilicate $Si(OC_2H_5)_4$) | Flow rate | 10.5 cc/min |
|---|---|---|
| He | Flow rate | 5,000 cc/min |
| Discharge gap | | 10 mm |
| Power source output | 80 W | 1.1 kV 2 $kH_z$ |

EXAMPLE 4

In Example 3, explanations have been made to a case of forming a film by forming a tightly closed discharge gap. In this case, explanation will be made in a case of using a film-forming device constructed as a linear blown type referring to FIG. 4.

In the linear blowing type film-forming device (30), a gas supply tube (35) of a double tube structure is connected to one end, while an exhaust tube (38) is connected to the other end at the closed upper portion of a box-like discharge section (31), and a pair of electrodes (32),(33), each laminated with a dielectric material such as glass on a narrow plate-like electrode surface, are disposed by a plurality of pairs by way of an insulative separator (not illustrated) to the open lower end, to constitute a discharge space (34).

The inside of the discharge section (31) has a double duct structure comprising a duct (36) for gas A and a duct (37) for gas B such that the gas A and the gas B can be supplied individually from the gas supply tube (35) and they are mixed in the discharge space (34) into a required reaction gas.

When the reactive gas is introduced into the discharge space (34) kept at an atmospheric pressure of 0.5 $kg/cm^2$ and a required voltage is applied between the high voltage electrode (32) and the grounding electrode (33), glow discharge is caused to generate plasma excitation in the reaction gas and a thin film can be formed depending on the kind of reaction gas to the surface of the material to be deposited with a film opposed to the blowing port of the discharge section (31).

Further, the exhaust gas after the reaction Jetted out from the discharge space (34) is turned at a skirt (39) disposed at the open lower end of the discharge section (31), uprises between the inner wall of the discharge section (31) and the duct (37) for the gas B, and is discharged from the exhaust pipe (38) at the upper end of the discharge section (31) and then recovered and regenerated as an inert gas or like. The inert gas or like can be regenerated, if desired.

For instance, an $SiO_2$ film is formed under the following conditions in an example of a material to be formed with a film prepared by depositing an enamel dielectric material on the electrode as in Example 3.

That is, the electrode cell is heated by a heater to 200° to 300° C. and TEOS+He are introduced into the gas A and $O_2$ is introduced into the gas B in the discharge electric discharge section (31) applied with a predetermined voltage, to decompose TEOS and deposit a film of $SiO_2$ to the surface of the dielectric material of the electrode cell.

In the Examples 1, 2, 3 and 4 described above, $H_2$, Ne, Ar, $N_2$, etc., may be used alone or as a mixture properly for the inert gas, and it is preferred to use a rare gas mainly composed of He as a dilution gas for maintaining a stable glow discharge near atmospheric pressure.

Further, the starting gas to be introduced in admixture with the inert gas or like is required to have a function that the protection film formed can prevent the abrasion of the dielectric material and the electrode and melting of ions and molecules due to the electric discharge and to have a nature as a dielectric material. For instance, in a case where the protection film is $SiO_2$, there can be used TEOS, mono silane ($SiH_4$) (thermal decomposition), disilane ($SiH_6$), silicon tetrachloride ($SiCl_4$) (hydrogen reduction) or oxygen ($O_2$) in a case where the protection film is $SiO_2$ and mono silane ($SiH_4$), disilane ($Si_2H_6$) silicon tetrachloride ($SiCl_4$), nitrogen ($N_2$), or ammonia ($HN_3$) in a case where the protection film is $SiN_2$.

The mixing ratio between the inert gas or like and the starting gas is optional within the range capable of maintaining stable glow discharge at an atmospheric pressure of 0.2 $kg/cm^2$, but it is preferred that the inert gas or like concentration more than about 65%, in particular, more than about 90%. As the reaction gas introduced, a plurality of spacies of gases may also be used.

Generally speaking, glow discharge does not take place easily under an atmospheric pressure, but stable glow discharge is possible at or near the an atmospheric pressure since a glass dielectric material is deposited, for example, so as to surround the high voltage electrode and the inert gas is introduced.

Referring to the plasma excitation in the reaction gases, the glow discharge excites the inert gas as the dilution gas to form plasma ar high energy exited state. Further, the reaction gas causes chemical reaction by being dessociated and ionized in the plasmas to deposit reaction products on the surface of solid.

The plasmas are formed by applying a high voltage and an AC voltage is applied is used for exciting an alternating voltage on the electric material, for which a high frequency voltage from several tens $H_z$ to several $MH_z$ may be used, which can be properly selected depending on the kind of the protection film, property of the surface to be treated and the time for the surface treatment and also may be selected properly depending on the constitution of the ozone generator, the discharge space, the inert gas or like and the starting gas, which is preferably within a range from 1 to 10 kV, from 500 to 13.56 MHz and from 10W to several KW.

For obtaining a stable glow discharge, an appropriate means can be adopted such as gradual increase of the discharge current or use of pulsative power source.

Further, a multi-layered film can be formed by conducting the film formation in accordance with the present invention for several times while replacing the reaction gas.

EXAMPLE 5

Figure 5:
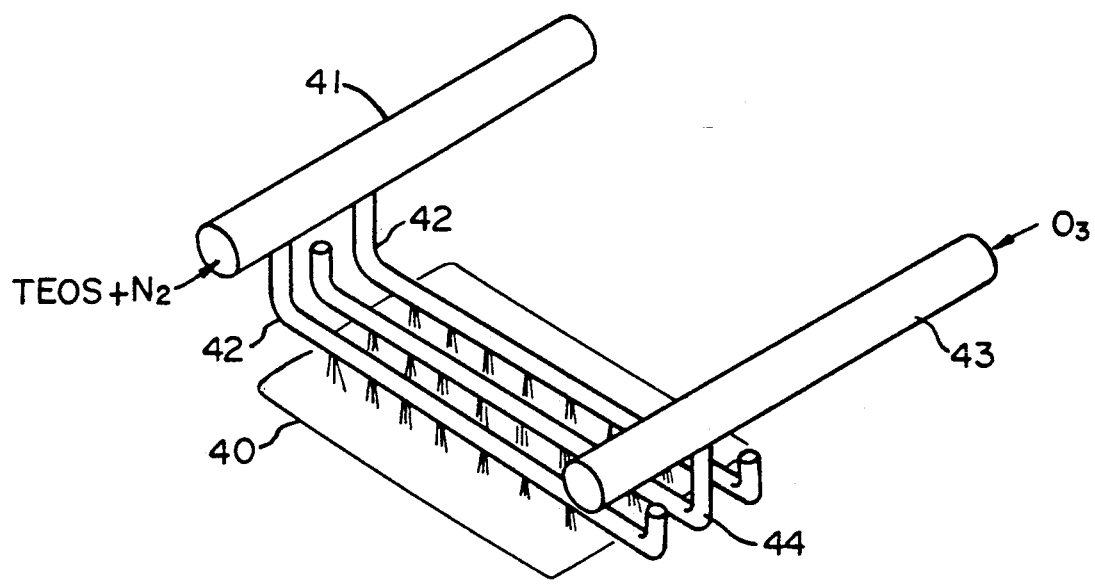
FIG. 5 is a schematic explanatory view of a hot CVD device showing a film forming method according to the present invention.

FIG. 5 shows an example of a device forming an $SiO_2$ film on the surface of a dielectric material of an electrode having a large surface area, in which TEOS is decomposed with $O_3$ gas at the surface of the dielectric material at an atmospheric pressure of 0.2 $kg/cm^2$ to form an $SiO_2$ film. A plurality of branched pipes (42) are disposed to a supply pipe (41) for TEOS+$N_2$ gas each on which are disposed gas apertures so that reaction gas can be sprayed to the surface of a material (40) to be formed with film.

Further, a plurality of branched pipes (44), each disposed with gas apertures so that $O_3$ gas can be sprayed to the surface of the material (40) to be formed with film, are also disposed to an $O_3$ supply tube (43). The film-formed material (40) opposed to the gas apertures for each of the branched pipes (42), (44) with a gap of 8 to 15 mm, preferably, 10 to 12 mm is heated by means of a heater(not illustrated) to 150° to 350° C., preferably, 200° to 300° C., by which TEOS is decomposed by $O_3$ gas at the surface of the dielectric material of the film-formed material (40) and the $SiO_2$ film can be formed.

EXAMPLE 6

Figure 6:
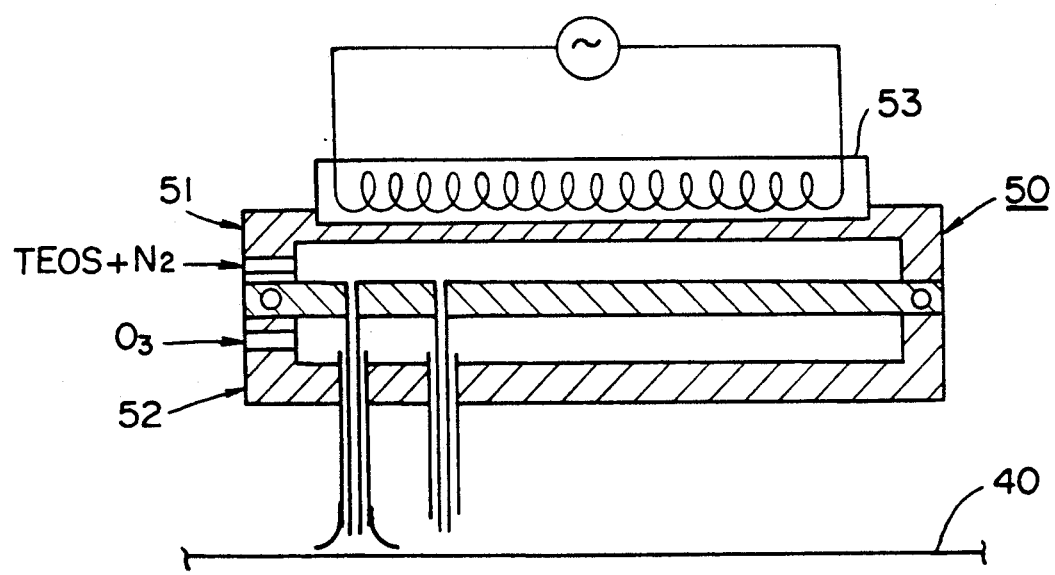
FIG. 6 is a schematic explanatory view for another hot CVD device.

FIG. 6 also shows an example of decomposing TEOS with $O_3$ gas at the surface of a dielectric material at an atmospheric pressure of 0.2 kg/cm² to form an $SiO_2$ film like that in Example 5.

A gas mixer (50) for bubbling TEOS with $N_2$ and mixing them with $O_3$ gas at the surface of a material (40) to be formed with film may comprise various structures such as a double-walled structure as described above. In this embodiment, a plate-like TEOS+$N_2$ gas supply section (51) and an $O_3$ gas supply section (52) are disposed in lamination and double-walled pipe passing through both of the sections are appropriately disposed, in which TEOS is bubbled with $N_2$ and they are mixed with $O_3$ at the surface of the film-formed material (40). A heater (59) for elevating temperature up to about 100° C. is disposed to TEOS+$N_2$ gas supply section (51).

The film-formed material (40) is heated to 200°-300° C. by a heater, not illustrated.

By properly selecting the distance between the gas blowing port of the mixer (50) and the surface of the film-formed material (40) depending on the flow rate and the flow velocity, etc., of the gas so that the film thickness is made uniform, by which TEOS is decomposed with $O_3$ gas to form an $SiO_2$ film on the surface of the dielectric material of the film-formed material (40).

Industrial Applicability

In accordance with the present invention, it is possible to easily and inexpensively dispose a protection film made of $SiO_2$ or $SiN_x$ to the dielectric material of an ozone generator, and this can prevent the surface substances of the dielectric material from melting in the electric discharge and intrude as a impurity as an ozone gas.

The ozone generator according to the present invention can supply an ozone gas at high concentration used for the manufacture of semiconductors requiring extremely high cleanness.

We claim:

1. In an assembled ozone generator which comprises first and second electrodes which are spaced apart so as to define an electric discharge gap therebetween, and a dielectric material on said first electrode so as to provide an exposed surface which faces said electric discharge gap, a method of applying a few μm thick protective film of $SiN_2$ on said exposed surface of said dielectric material which comprises the steps of: (a) passing a reaction gas at a pressure of between $10^{-2}$ Torr and atmospheric pressure through said electric discharge gap, said reaction gas comprising an inert gas and a starting gas, and (b) applying a high voltage between said first and second electrodes to provide a glow discharge therebetween at said pressure and cause said starting gas to deposit a protective film of $SiN_2$ on the exposed surface of said dielectric material.

2. The method of claim 1, wherein the protective film applied to said exposed surface of said dielectric material has a thickness of 2 μm.

3. The method of claim 1, wherein said pressure is between $10^{-2}$ Torr and 0.5 kg/cm².

4. The method of claim 3, wherein said pressure is between 0.2 and 0.5 kg/cm².

* * * * *